United States Patent [19]
Boss et al.

[11] 3,765,960
[45] Oct. 16, 1973

[54] METHOD FOR MINIMIZING AUTODOPING IN EPITAXIAL DEPOSITION

[75] Inventors: David W. Boss, Beacon; Bernard M. Kemlage, Hopewell Junction; Vincent J. Lyons, Poughkeepsie; Hans B. Pogge, La Grangeville, all of N.Y.

[73] Assignee: International Business Machines Corporation, Armonk, N.Y.

[22] Filed: Nov. 2, 1970

[21] Appl. No.: 86,208

[52] U.S. Cl. .............. 148/175, 117/201, 117/106 A, 117/107.2 R
[51] Int. Cl. .............. H01l 7/36, C23c 13/02
[58] Field of Search .............. 148/175; 117/106 A, 117/107.2 R, 201

[56] References Cited

UNITED STATES PATENTS

| | | | |
|---|---|---|---|
| 3,669,769 | 6/1972 | Badami et al. | 148/175 |
| 3,172,792 | 3/1965 | Handelman | 148/175 |
| 3,489,621 | 1/1970 | Sirtl | 148/175 |
| 3,177,100 | 4/1965 | Mayer et al. | 148/175 |
| 3,484,311 | 12/1969 | Benzing | 148/175 X |
| 3,364,084 | 1/1968 | Ruehrwein | 148/175 |
| 3,508,962 | 4/1970 | Manasevit et al. | 117/106 |

*Primary Examiner*—Oscar R. Vertiz
*Assistant Examiner*—J. Cooper
*Attorney*—Hanifin and Jancin and Wolmar J. Stoffel

[57] ABSTRACT

Autodoping is minimized during the growth of an epitaxial layer on a semiconductor substrate by contacting the substrate with a gaseous reaction mixture at a low pressure, substantially below atmospheric to deposit at least the initial capping layer.

The reaction mixture contains a relatively minor portion of a semiconductor compound along with a carrier gas. Subsequently, a second gaseous reaction mixture containing a greater portion of a compound of a semiconductor material may be used to complete the deposition of the epitaxial layer. This is done merely to reduce the total growth cycle.

2 Claims, 8 Drawing Figures

INVENTORS
DAVID W. BOSS
BERNARD M. KEMLAGE
VINCENT J. LYONS
HANS B. POGGE

BY Wolmar J. Stoffel
ATTORNEY

METHOD FOR MINIMIZING AUTODOPING IN EPITAXIAL DEPOSITION

BACKGROUND OF THE INVENTION

1. Field of the Invention

The present invention relates to the growth of epitaxial, polycrystalline and amorphous layers on semiconductor substrates and more particularly to a method for achieving a control over the impurity concentration level in the epitaxial layer or other deposited layer.

2. Background of the Prior Art

The term "epitaxy," is known to those skilled in the art, implies a continuation of the lattice structure of a crystalline substrate into a deposited material. In the semiconductor industry a layer of semiconductor material is conventionally deposited on a monocrystalline semiconductor wafer wherein the crystal lattice of the layer is a continuation of the base wafer. The active regions of the devices are fabricated into the epitaxial layer and the base wafer serves basically as a support.

In fabricating integrated circuit devices, it is conventional to diffuse impurities into the base wafer to form subcollector regions in order to fabricate transistors into the epitaxial layer. It has been noted that during the initial phases of the epitaxial deposition cycle impurities escape from these regions and are spread laterally over the surface of the wafer. These impurities become incorporated into the top of the substrate prior to film growth and into the epitaxial layer during growth. In certain types of substrates wherein the base wafer and the epitaxial layer is doped with the same type of impurity the opposite type of impurity spreading from diffused regions of the substrate is incorporated to a degree sufficient to change the doping of the interface region. In other devices where the diffused region and the epitaxial layer are of the same conductivity type and opposite to that of the base wafer, variation in resistivities occur in the epitaxial film with lower resistivities occuring nearest the interface region. This may have detrimental effects on device performance. As semiconductor technology developed, devices became increasingly miniaturized, and active as well as passive devices embodied therein were positioned more closely together. The problem presented by the autodoping phenomena, therefore, became more serious. This is particularly true in applications utilizing a self-isolation scheme as set forth in commonly assigned patent application Ser. No. 875,012 (FI 9-64-055) which discloses a process wherein devices are formed in regions that are produced by outdiffusing a heavily doped region in the base wafer upwardly into the epitaxial layer. In such instances, the wafer base and overlying epitaxial layer are doped with a similar type impurity. Autodoping produces thin expanded impurity regions at the interface of the wafer and epitaxial layer which may overlap when the devices are closely spaced thereby causing objectionable internal shorting. Autodoping also causes problems in other active and passive devices when it results in undesirable and uncontrolled impurity profiles. A specific example is in the forming of a resistor in an epitaxial layer. A non-uniform doping of that layer may cause higher conductivity regions within the resistor which complicates process control and performance.

Three main types of chemical vapor epitaxial growth processes are known e.g., disproportionation process, pyroltytic decomposition processes, and compound reduction processes.

Basically, in the vapor epitaxial growth using a disproportionation reaction, a material which is a semiconductor constituent is formed into a compound with a carrier element or material at one temperature in the deposition system, and is released or disproportionated from the carrier material at another lower temperature at the substrate which is typically monocrystalline.

In pyrolytic decomposition processes, a compound of which the semiconductor is one constituent is decomposed by heat in the vicinity of the substrate and the semiconductor compound constituent of the substrate lattice is extended by that constituent.

In a compound reduction process, typically the element to be deposited is introduced in the form of a gaseous compound which is subsequently reduced, typically by hydrogen, at the substrate site which is normally heated to a temperature substantially above the ambient temperature.

Epitaxial growth typically takes place at elevated temperatures. For example, the epitaxial deposition of silicon on a silicon substrate occurs normally in the temperature range of 900°–1200° C.

In the fabrication of integrated circuit devices it is convenient to deposit an epitaxial layer on a semiconductor substrate over diffused regions in the substrate. At the temperature at which epitaxial growth occurs, the impurity atoms in a diffused region has a sufficient activity to escape from the diffused region.

It has been demonstrated that the main gas flow within a typical reactor creates a layer of relatively static gas in the immediate vicinity of the substrate surface. At growth temperatures, some of the escaping impurity atoms will have sufficient energy to leave this gas layer and enter the main gas flow, although most of the impurity atoms from the diffused region lack sufficient energy to penetrate the boundary layer. As a result, the impurity atoms are laterally distributed within the generally static gas layer since there are no thermal or aerodynamical restrictions to lateral motion of the atoms within the layer. This results in the possibility of impurity atoms being redeposited onto the surface of the substrate or growing film not only over the diffused region but also over the non-diffused substrate regions. This lateral drift of the impurity atoms is due to the tendency to establish an equilibrium of the impurity concentration within the gas phase of the boundary layer, causing the epitaxial film or layer to be autodoped at substantial distances from the diffused region in the substrate. The distribution is relatively insensitive to the general direction of the main gas flow. The impurity concentration decreases away from the diffused region but is still significant at substantial distances from the diffused region.

The present invention provides a method for growing an epitaxial layer so that it does not have an uncontrolled impurity concentration due to autodoping. The invention results in a significant reduction of autodoping from the diffused region of a substrate by controlling the degree of redeposition of escaped impurities.

SUMMARY OF THE INVENTION

The object of this invention is to provide a method for minimizing autodoping wherein the pressure of the gaseous reaction mixture used to produce the epitaxial layer is reduced significantly below atmospheric during the process. A reduced pressure is used during the formation of at least the initial capping layer. The pressure may be subsequently increased to standard pressure without effecting the previously deposited layer.

Autodoping during epitaxial deposition of a semiconductor on a base wafer having a diffused region therein is minimized by maintaining the pressure of the gaseous reaction mixture in the range of 0.01 to 150 torr at least during the forming of the initial epitaxial deposit. The reduced pressure of the gaseous reaction mixture changes the nature of the boundary layer allowing significantly greater amounts of the inherently escaping impurity to be dissipated to the reactant stream. The gaseous reaction mixture includes a carrier gas and a compound of semiconductor material. The pressure of the reaction mixture is preferably increased after the initial capping layer is formed to reduce the length of the total deposition time required to form the epitaxial layer.

BRIEF DESCRIPTION OF THE DRAWINGS

The foregoing and other objects, features and advantages of the invention will be more apparent from the following more particular description of preferred embodiments of the invention as illustrated in the accompanying drawings.

IN THE DRAWINGS

Figure 1:
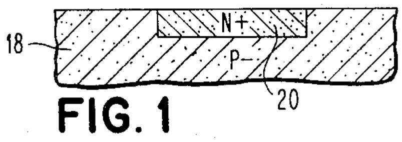
Figure 2:
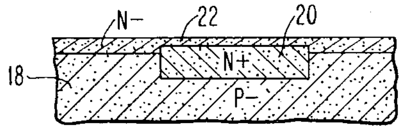
Figure 3:
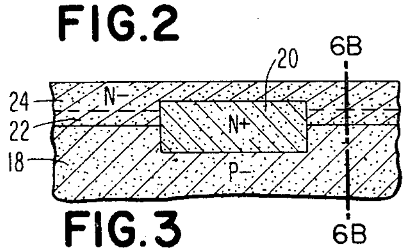

FIG. 1 through 3 is a sequence of elevational view in broken cross-section of a semiconductor wafer illustrating the structure during various stages of the process of the invention.

Figure 4:
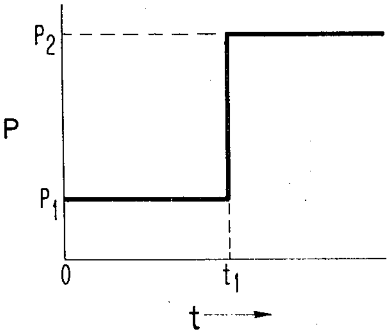

FIG. 4 is a graph of gaseous reaction pressure within the reactor versus deposition time depicting a preferred mode of practicing the method of the invention.

Figure 5:
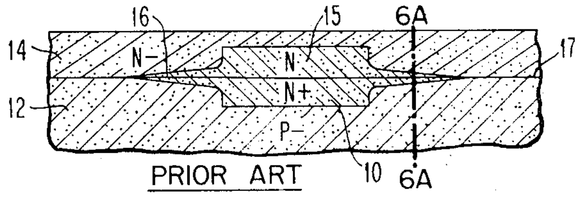

FIG. 5 is an elevational view in cross-section of a semiconductor device illustrating the profile produced by autodoping during the deposition of an epitaxial layer by prior art techniques.

Figure 6:
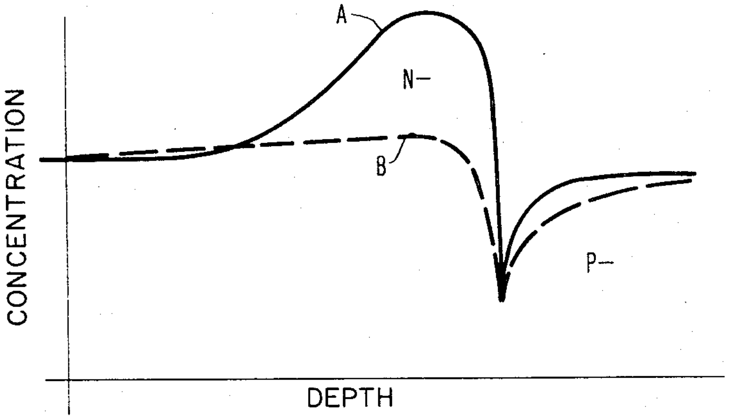

FIG. 6 is a graph of impurity concentration versus depth illustrating the impurity profile in a device of the type shown in FIG. 5 resulting from an uncontrolled auto deposition process and comparing same with a profile produced by the process of the invention.

Figure 7:
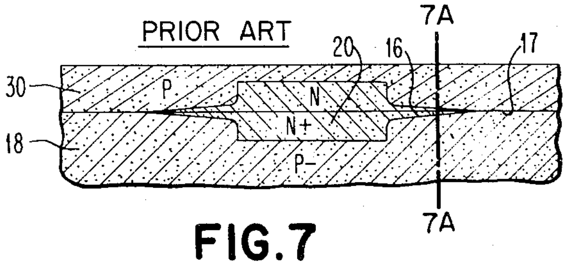

FIG. 7 is an elevational view of a semiconductor device illustrating the nature of the region in an P epi layer resulting from prior art epitaxial deposition techniques.

Figure 8:
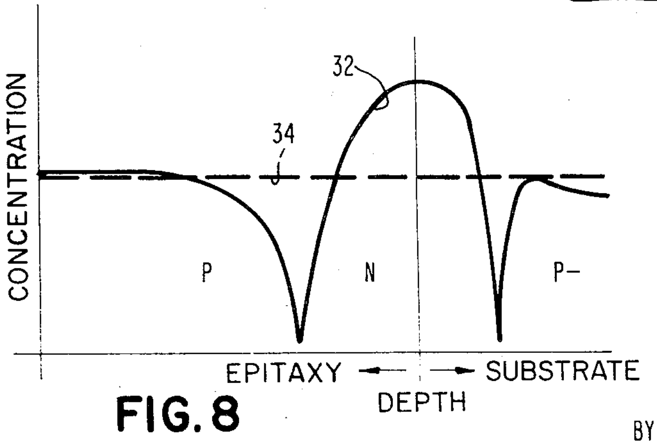

FIG. 8 is a graph of impurity concentration versus depth taken along 8A in FIG. 7.

DETAILED DESCRIPTION OF THE PREFERRED EMBODIMENTS

Referring now to the drawings, FIG. 5 illustrates the configuration of an outdiffused impurity region in an epitaxial layer being deposited by conventional prior art techniques. As illustrated, diffused region 10 in semiconductor wafer 12 produces in an epitaxial layer 14, a region 15 having long laterally extending regions 16 about region 10 located at the interface between wafer 12 and layer 14. Region 16 in some types of devices cause shorts between active elements and also alter the characteristics of resistors when integrated circuit devices are fabricated in layer 14. In FIG. 6 curve A depicts the profile taken on line 6A which indicates a relatively heavy impurity concentration adjacent the interface.

FIG. 7 depicts the nature of a diffused region 20 made in a P-substrate 18 with a P doped epitaxial layer 30 deposited thereon by techniques known to the prior art which fail to control autodoping. Note that the diffused region includes a thin laterally extending region 16 located at the interface 17 between substrate 18 and epitaxial layer 30. FIG. 8 indicates the impurity profile 32 of the device shown in FIG. 7 taken along 7A. Profile 34 depicts for comparison the profile of a similar device without the laterally extending regions in which the techniques used by this invention are used to control autodoping.

FIG. 1 depicts a monocrystalline wafer 18 doped with a P type impurity with the diffused region 20 having a relatively high concentration of N type impurity. A thin initial expitaxial layer 22 is grown on base wafer 18 by positioning the wafer in an epitaxial reactor, heating the wafer to a temperature where epitaxial growth will occur, and contacting it with a gaseous reaction mixture capable of depositing semiconductor material. The gaseous reaction mixture contains a compound of semiconductor material, a carrier gas, and normally an impurity material used to dope the resultant epitaxial layer. Upon coming in contact with the heated water, the semiconductor material will deposit on the wafer forming a continuation of the original crystal lattice of the wafer as illustrated in FIG. 2. In the process of this invention in order to minimize the autodoping effect during the deposition of layer 22, the vapor pressure of the initial gaseous mixture introduced into the reactor is maintained at a relatively low value in the range of 0.01 to 150 torr, more preferably in the range of 1 to 75 torr. In theory a boundary layer is formed over the surface of the wafer 20. This boundary layer is a region of definite thickness which may differ greatly in thermal, chemical, and aerodynamic properties from the main stream of the gases within the reactor. The dimensions of the boundary layer are determined by linear gas streaming velocity, temperature, gaseous pressure and other factors. By maintaining a low gaseous reaction mixture pressure, impurities which escape from region 20 into the boundary layer have a greater probability of avoiding entrapment in the semiconductor material as epitaxial deposition proceeds. A vacuum pump is used to maintain a low pressure within the reactor. As shown in FIG. 3 when practicing the method of this invention the impurities in region 20 diffuse upwardly but there is no significant lateral displacement at the interface of base 18 and layer 22. The pressure of the reaction mixture used to complete the growth of the epitaxial layer 22 is influenced to a degree by the composition and nature of the gaseous reaction mixture, the rate of the gas flow, and the geometry of the reactor.

FIG. 4 illustrates graphically the pressure control used to practice the method in the invention. The initial layer 22 is deposited with the reaction mixture at $P_1$. At the end of time $t_1$ the pressure is increased to $P_2$ and the deposition continued until the desired thickness of the epitaxial layer 24 is achieved. It is understood that the pressure can be increased in a single step, as indicated in FIG. 4, or alternately can be gradually increased, or alternatively maintained constant throughout the film deposition.

Gaseous reaction mixtures used to deposit epitaxial layers are well known in the art. Gaseous reaction mixtures normally include a compound of a semiconductor material, such as $SiH_4$, $SiCl_4$, $SiHCl_3$, $GeH_4$, $GeI_4$, a carrier gas, and, when required, a reducing gas. The reducing gas is typically hydrogen which can also serve as a carrier gas alternatively, the carrier could be inert gases such as nitrogen, argon, or the like. Normally an impurity is included in the gaseous reaction mixture. In general the composition of the reaction mixture is adjusted so that a layer growth rate in the range of 0.01 to 2 microns per minute, more preferably 0.1 to 0.5 microns per minute, is achieved at the pressure selected. If a lower pressure is selected, the relative amount of carrier gas can be decreased. When the reaction mixture includes $SiH_4$, and a carrier gas such as $H_2$, the composition will preferably have $SiH_4$ in the range of 0.01 to 1.0 percent by volume, more preferably 0.03 to 0.3 percent by volume. The composition of the reaction mixture is preferably maintained constant during the deposition of the initial epitaxial layer and the final deposition at the higher pressure. During the deposition the wafer is supported on a susceptor which can be heated by induction, by resistance or by radiation to a temperature in the range of 800° to 1300° C, for silicon deposition. After the initial epitaxial deposit is made the remaining portion of the layers can be deposited at higher pressures, as for example atmospheric pressure.

Curve B in FIG. 6 depicts the profile produced by the method of the invention. For comparison, Curve A depicts the profile taken at a point adjacent the semiconductor region in a device wherein the epitaxial layer is deposited by methods known to the prior art. As indicated, a region of high concentration of an escaped and re-deposited impurity exists at the interface of the base wafer and the epitaxial layer resulting in an undesirable structure property.

The following examples are included to depict a preferred specific embodiment of the method of the invention and should not be construed to unduly limit same.

EXAMPLE I

A P-type silicon wafer having a selected area diffused region with an arsenic impurity surface concentration of $1 \times 10^{21}$ atom per cc was placed in a standard horizontal open tube reactor on a R.F. inductively heated susceptor. The reactor was then purged by introducing a flow of hydrogen at 10 liters per minute for 10 minutes. The reactor was then pumped to a pressure of $1 \times 10^{-3}$ torr and $H_2$ admitted at 2,500 cc. per minute. The vacuum system was adjusted to maintain a pressure within the reactor of 20 torr. The wafer temperature was raised to 1,050° C and $SiH_4$ admitted at a flow rate of 2 cc. per minute. The additional $SiH_4$ did not significantly alter the reactor pressure. After 20 minutes the flow of $SiH_4$ was terminated and the power to the susceptor shut off. In 20 minutes the wafer temperature dropped to approximately room temperature. After removal from the reactor, the wafer was visually inspected, beveled to facilitate film thickness measurement and electrically profiled along a line 50 mils from the edge of the diffused region by spreading resistance techniques. The growth rate was computed at 0.2 microns per minute. A study of the electrical profile indicated that there was no measurable autodoping since the impurity level adjacent the interface was substantially the same as the background doping of the epitaxial layer.

EXAMPLE II

A wafer similar to the one described in EXAMPLE I was placed in a reactor subjected to the same purge techniques, and then an epitaxial layer grown by introducing into the reactor a gaseous mixture having the same composition as that used in EXAMPLE I, except that the pressure in the reactor was substantially atmospheric pressure. Specifically, a flow of 10 liters per minute of $H_2$ was admitted to the reactor to which was added a second flow of $SiH_4$ at 8 cc. per minute. After a 20 minute growth period, the wafer was cooled, subsequently inspected and tested as in EXAMPLE I. The profile at the same distance from the diffused region indicated substantial autodoping, causing a change in conductivity type in the region of the film substrate interface.

EXAMPLE III

Three additional runs were made on wafers similar to the wafer described in EXAMPLE I using the identical procedure and reaction mixture composition. However, the epitaxial layers were grown at 50, 75, and 150 torr respectively. Examination of the layer at 55 torr showed an absence of autodoping. The layer grown at 75 torr indicated no significant autodoping although there was small build-up of impurity that would ordinarily not present a problem. The layer grown at 150 torr indicated a significant build-up of impurity at the interface. However, the build-up was less than that in the wafer produced in EXAMPLE II.

While the invention has been particularly shown and described with reference to preferred specific embodiments thereof it will be understood by those skilled in the art that the foregoing and other changes in the form and details may be made therein without departing from the spirit and scope of the invention.

What is claimed is:

1. A process for minimizing autodoping during deposition of an epitaxial layer of silicon semiconductor material from a gaseous phase on a heated silicon monocrystalline semiconductor wafer, which wafer includes regions embodying diffused semiconductor impurity comprising:

contacting said wafer with a gaseous reaction mixture comprising hydrogen and from 0.01 to 1.0 percent $SiH_4$ by volume at a temperature between 800° and 1300° C, and maintaining the pressure of said gaseous mixture in the range of 0.01 to 150 torr for at least the time necessary to deposit an epitaxial layer at a rate between 0.01 and 2 microns per minute on the surface of said wafer.

2. A process in accordance with claim 1 wherein the gaseous mixture contains from 0.03 to 0.3 percent of $SiH_4$ by volume.

* * * * *